(12) United States Patent
Park

(10) Patent No.: US 7,705,665 B2
(45) Date of Patent: Apr. 27, 2010

(54) DIGITAL TUNING CIRCUIT OF GM-C FILTER

(75) Inventor: Kyoung Seok Park, Gyunggi-Do (KR)

(73) Assignee: Samsung Electro-Mechanics Co., Ltd., Suwon, Gyunggi-Do (KR)

( * ) Notice: Subject to any disclaimer, the term of this patent is extended or adjusted under 35 U.S.C. 154(b) by 41 days.

(21) Appl. No.: 12/200,917

(22) Filed: Aug. 28, 2008

(65) Prior Publication Data

US 2009/0231027 A1   Sep. 17, 2009

(30) Foreign Application Priority Data

Mar. 13, 2008   (KR) .................. 10-2008-0023515

(51) Int. Cl.
*H03B 1/00* (2006.01)
*H03K 5/00* (2006.01)
*H04B 1/10* (2006.01)

(52) U.S. Cl. .................. 327/552; 327/554; 327/558

(58) Field of Classification Search .................. None
See application file for complete search history.

(56) References Cited

U.S. PATENT DOCUMENTS 4,484,089 A   11/1984   Viswanathan

| | | | |
|---|---|---|---|
| 5,572,163 A * | 11/1996 | Kimura et al. | 327/553 |
| 6,172,569 B1 * | 1/2001 | McCall et al. | 330/303 |
| 6,326,838 B1 * | 12/2001 | Kimura et al. | 327/552 |
| 6,977,542 B2 * | 12/2005 | Ganeshan et al. | 327/553 |
| 7,239,197 B2 * | 7/2007 | Chen et al. | 327/553 |
| 2002/0008572 A1 | 1/2002 | Hayashi et al. | |
| 2005/0212590 A1 * | 9/2005 | Dong | 327/553 |

FOREIGN PATENT DOCUMENTS

KR   2004-0022604 A   3/2004

* cited by examiner

*Primary Examiner*—Tuan Lam
(74) *Attorney, Agent, or Firm*—Lowe Hauptman Ham & Berner

(57) ABSTRACT

Provided is a tuning circuit of a $G_m$ (transconductance)-C (capacitance) filter. The tuning circuit tunes a transconductance using direct current incorporating variations of a capacitance, instead of a clock signal, in a $G_m$ tuning mode, while using the clock signal in a capacitance tuning mode. As such, it is possible to prevent deterioration of a received signal caused by the clock signal.

7 Claims, 5 Drawing Sheets

DIGITAL TUNING CIRCUIT OF GM-C FILTER

CROSS-REFERENCE TO RELATED APPLICATIONS

This application claims the priority of Korean Patent Application No. 2008-23515 filed on Mar. 13, 2008, in the Korean Intellectual Property Office, the disclosure of which is incorporated herein by reference.

BACKGROUND OF THE INVENTION

1. Field of the Invention

The present invention relates to a tuning circuit of a $G_m$ (transconductance)-C (capacitance) filter, and more particularly, to a digital tuning circuit of a $G_m$-C filter for tuning a transconductance using direct current (DC) incorporating variations of a capacitance, instead of using a clock signal, in a $G_m$ tuning mode, while using the clock signal in a capacitance tuning mode.

2. Description of the Related Art

In general, cut-off frequencies of integrated circuit filters are varied by processes and temperature variations. In order to correct the cut-off frequencies, there is required a tuning circuit for performing adaptive correction for compensating for the temperature variations. For example, for a $G_m$-C filter, there is a need for keeping a constant ratio of the transconductance to the capacitance. Similarly, for an active RC, there is a need for keeping a constant ratio of the resistance to the capacitance.

In addition, the $G_m$-C filter also requires a tuning circuit for performing the adaptive correction for compensating for the temperature variations. Herebelow, such a tuning circuit of the $G_m$-C filter will be described with reference to FIG. 1.

FIG. 1 is a block diagram of a typical tuning circuit of a $G_m$-C filter.

Referring to FIG. 1, the typical tuning circuit of the $G_m$-C filter includes a voltage controlled oscillator 10, a phase detector 20 and a low pass filter 30. The voltage controlled oscillator 10 includes a $G_m$ cell to generate a predetermined frequency. The phase detector 20 detects phase difference between an oscillation frequency output from the voltage controlled oscillator 10 and a reference frequency. The low pass filter 30 passes only low frequency components of the phase difference signal received from the phase detector 20 to remove noise before outputting the resultant phase difference signal to the voltage controlled oscillator 10.

Here, the voltage controlled oscillator 10 corrects the transconductance according to the phase difference signal received from the low pass filter 30.

As described above, the typical tuning circuit of the $G_m$-C filter shown in FIG. 1 is a PLL type circuit utilizing the voltage controlled oscillator. That is, the typical tuning circuit of the $G_m$-C filter compares the oscillation frequency generated by the voltage controlled oscillator and the reference frequency to keep a constant ratio of the transconductance to the capacitance.

The voltage controlled oscillator may be a ring type voltage controlled oscillator, a voltage controlled oscillator using a negative transconductance, or the like.

However, in such a typical tuning circuit of the $G_m$-C filter as shown in FIG. 1, the voltage controlled oscillator often operates in a large signal until the signal is restricted. Therefore, it may have characteristics different from those of filters operating in a small signal. In addition, the transconductance generated using the voltage controlled oscillator may be different from that generated using a filter. These may become more severe with environmental variations.

Furthermore, because such a correction circuit utilizes a clock signal as a reference signal to correct the frequency characteristics, signals may be affected by the clock signal.

SUMMARY OF THE INVENTION

An aspect of the present invention provides a digital tuning circuit of a $G_m$-C filter for tuning a transconductance using direct current incorporating variations of a capacitance, instead of a clock signal, in a $G_m$ tuning mode, while using the clock signal in a capacitance tuning mode.

An aspect of the present invention also provides a digital tuning circuit of a $G_m$-C filter that prevents deterioration of a received signal caused by a clock signal, reduces power consumption by using only one $G_m$ cell, and needs no separate loop filter and thus no external pin.

According to an aspect of the present invention, there is provided a digital tuning circuit of a $G_m$-C filter, including: a switched capacitor configured to operate in a capacitance tuning mode to charge/discharge a predetermined first reference voltage according to a clock signal, and output a first current incorporating process variations of a capacitance; a $G_m$ cell configured to operate in a $G_m$ tuning mode to perform $G_m$ tuning according to a $G_m$ tuning coefficient; a load resistor configured to convert the first current output from the switched capacitor to a first voltage in the capacitance tuning mode, and convert a second current output from the $G_m$ cell to a second voltage in the $G_m$ tuning mode; a D/A converter configured to vary a predetermined second reference voltage according to a DAC tuning coefficient, and convert the varied second reference voltage to a third voltage which is an analog voltage; an error detector configured to control capacitance tuning using a first difference voltage between the first voltage and the third voltage in the capacitance tuning mode, and control the $G_m$ tuning using the $G_m$ tuning coefficient corresponding to a second difference voltage between the second voltage and the third voltage in the $G_m$ tuning mode; and a DAC tuner configured to output to the D/A converter the DAC tuning coefficient corresponding to the first difference voltage according to the capacitance tuning control of the error detector in the capacitance tuning mode.

The switched capacitor may include: a capacitor connected between a ground voltage and a common node; a first switch connected between a first terminal of the first reference voltage and the common node; and a second switch connected between a second terminal of the first reference voltage and the common node, wherein the first switch and the second switch are alternately turned on according to the clock signal.

The error detector may enter the capacitance tuning mode when the operation of the digital tuning circuit is started to perform a feedback control until the first voltage and the third voltage become identical, and enter the $G_m$ tuning mode when the first voltage and the third voltage become identical to perform the feedback control until the second voltage and the third voltage become identical.

The switched capacitor may be disabled in the $G_m$ tuning mode.

The $G_m$ cell may be disabled in the capacitance tuning mode.

The DAC tuner may be disabled in the $G_m$ tuning mode.

The second reference voltage may correspond to a capacitance of the capacitor without the process variations in the $G_m$-C filter.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
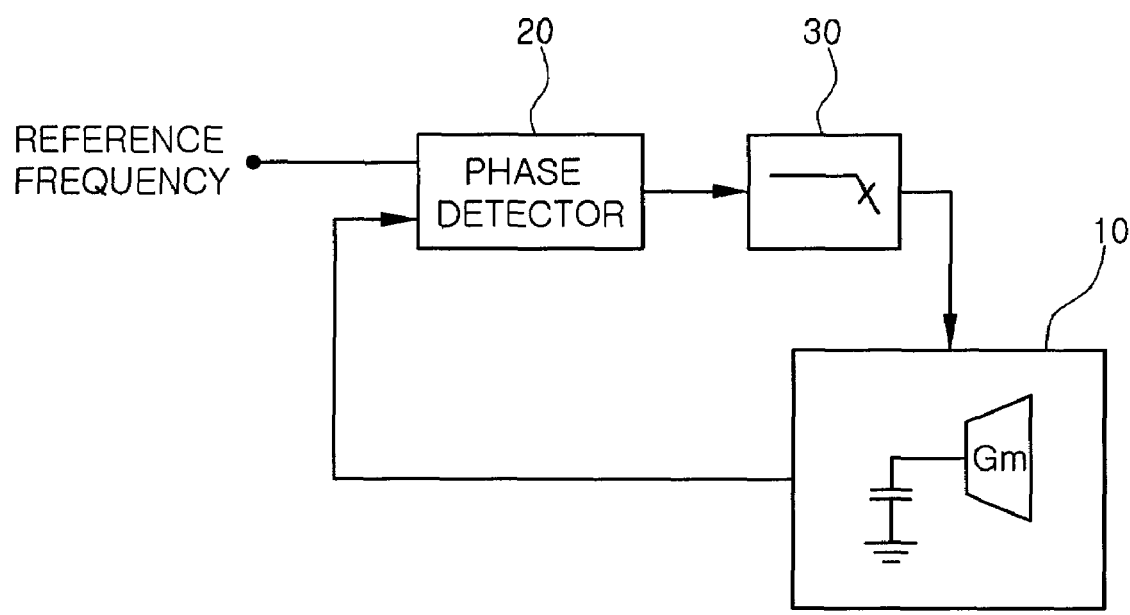
FIG. 1 is a block diagram of a typical tuning circuit of a $G_m$-C filter.

Exemplary embodiments of the present invention will now be described in detail with reference to the accompanying drawings.

Here, the present invention should not be construed as being limited to the embodiments set forth herein; rather, these embodiments are provided so that this disclosure will be thorough and complete, and will fully convey the concept of the invention to those skilled in the art. Like reference numerals in the drawings denote elements of substantially like configurations and functions.

Figure 2:
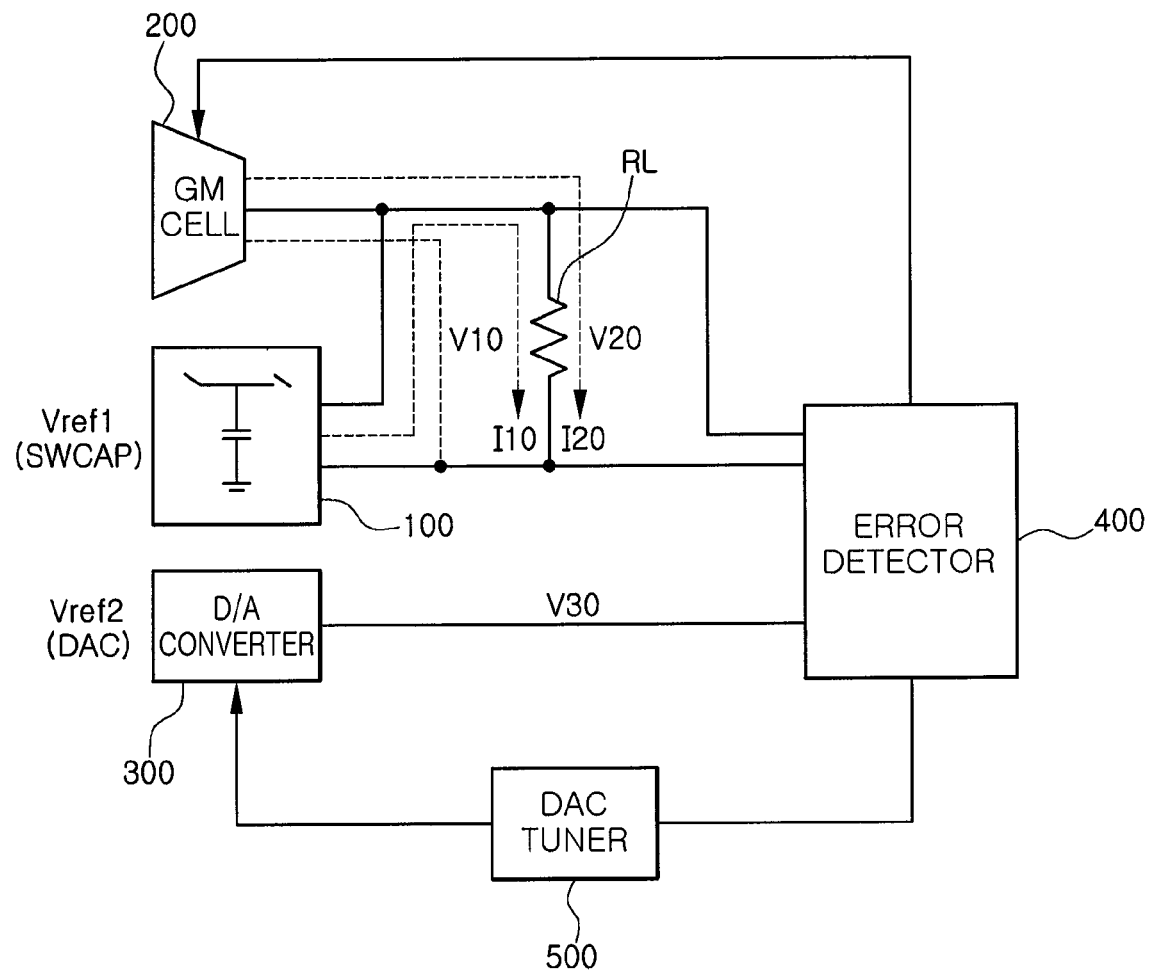
FIG. 2 is a block diagram of a tuning circuit of a $G_m$-C filter according to an embodiment of the present invention.

FIG. 2 is a block diagram of a tuning circuit of a $G_m$-C filter according to an embodiment of the present invention.

Referring to FIG. 2, the tuning circuit of the $G_m$-C filter includes a switched capacitor 100, a $G_m$ cell 200, a load resistor RL, a D/A converter 300, an error detector 400, and a DAC tuner 500.

The switched capacitor 100 operates in a capacitance tuning mode to charge/discharge a predetermined first reference voltage according to a clock signal, thereby outputting a first current I10 incorporating process variations of a capacitance.

The $G_m$ cell 200 operates in a $G_m$ tuning mode to perform $G_m$ tuning according to a tuning coefficient.

The load resistor RL converts the first current I10 output from the switched capacitor 100 to a first voltage V10 in the capacitance tuning mode, and converts a second current I20 output from the $G_m$ cell 200 to a second voltage V20 in the $G_m$ tuning mode.

The D/A converter 300 varies a predetermined second reference voltage according to the tuning coefficient, and converts the varied second reference voltage to a third voltage V30, which is an analog voltage.

The error detector 400 controls the capacitance tuning using a first difference voltage between the first voltage V10 and the third voltage V30 in the capacitance tuning mode. The error detector 400 also controls the $G_m$ tuning using a $G_m$ tuning coefficient corresponding to a second difference voltage between the second voltage V20 and the third voltage V30.

The DAC tuner 500 outputs to the D/A converter 300 a tuning coefficient corresponding to the first difference voltage according to the capacitance tuning control of the error detector 400 in the capacitance tuning mode.

Figure 3:
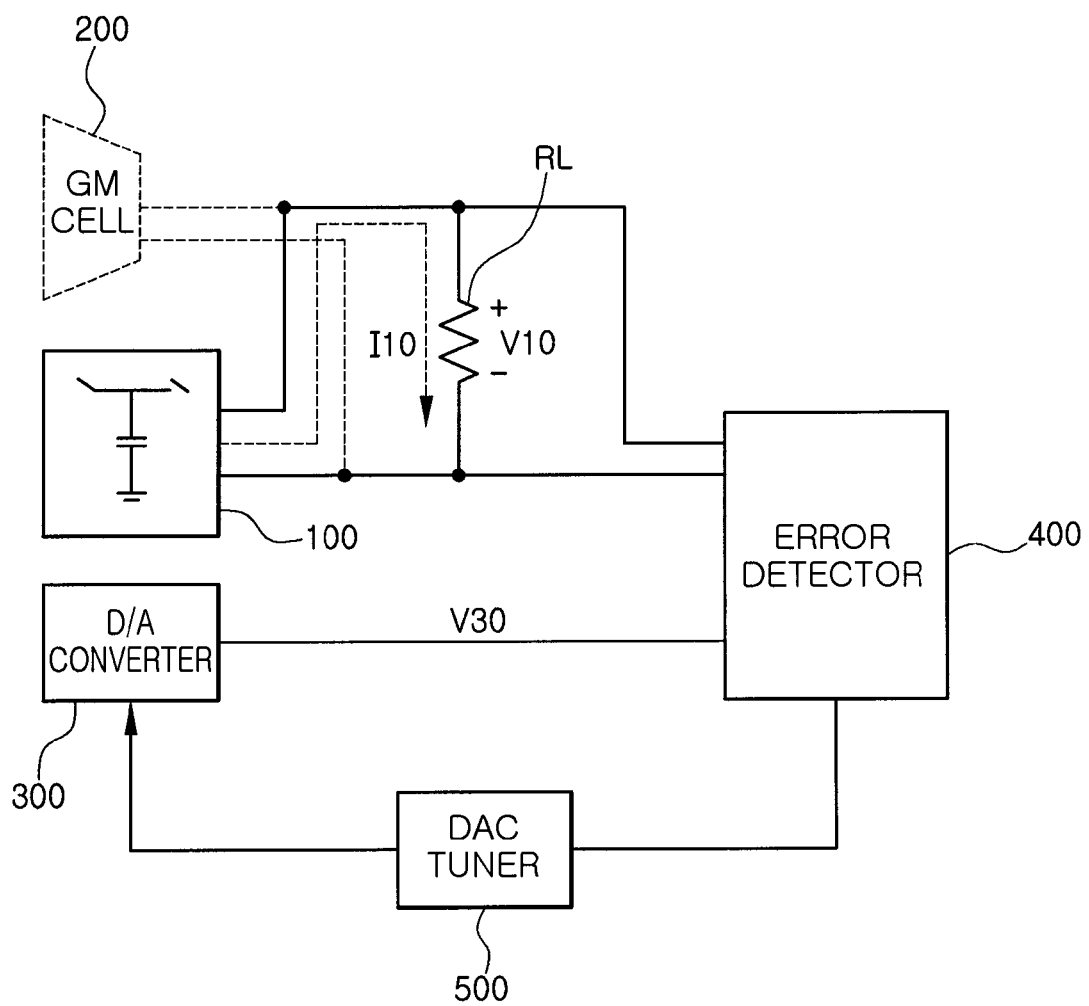
FIG. 3 is a block diagram of the tuning circuit of the $G_m$-C filter in a capacitance tuning mode according to the embodiment of the present invention.

FIG. 3 is a block diagram of the tuning circuit of the $G_m$-C filter in the capacitance tuning mode according to the embodiment of the present invention.

Referring to FIG. 3, in the capacitance tuning mode, feedback control is performed to make the third voltage V30 output from the D/A converter 300 become identical to the first voltage V10 output from the switched capacitor 100. Accordingly, the $G_m$ cell 200 can be disabled in the capacitance tuning mode.

Referring to FIGS. 2 and 3, the error detector 400 first enters the capacitance tuning mode to perform the feedback control until the third voltage V30 and the first voltage V10 become identical. Then, after the third voltage V30 and the first voltage V10 become identical, the error detector 400 enters the $G_m$ tuning mode to perform the feedback control until the third voltage V30 and the second voltage V20 become identical.

Figure 4:
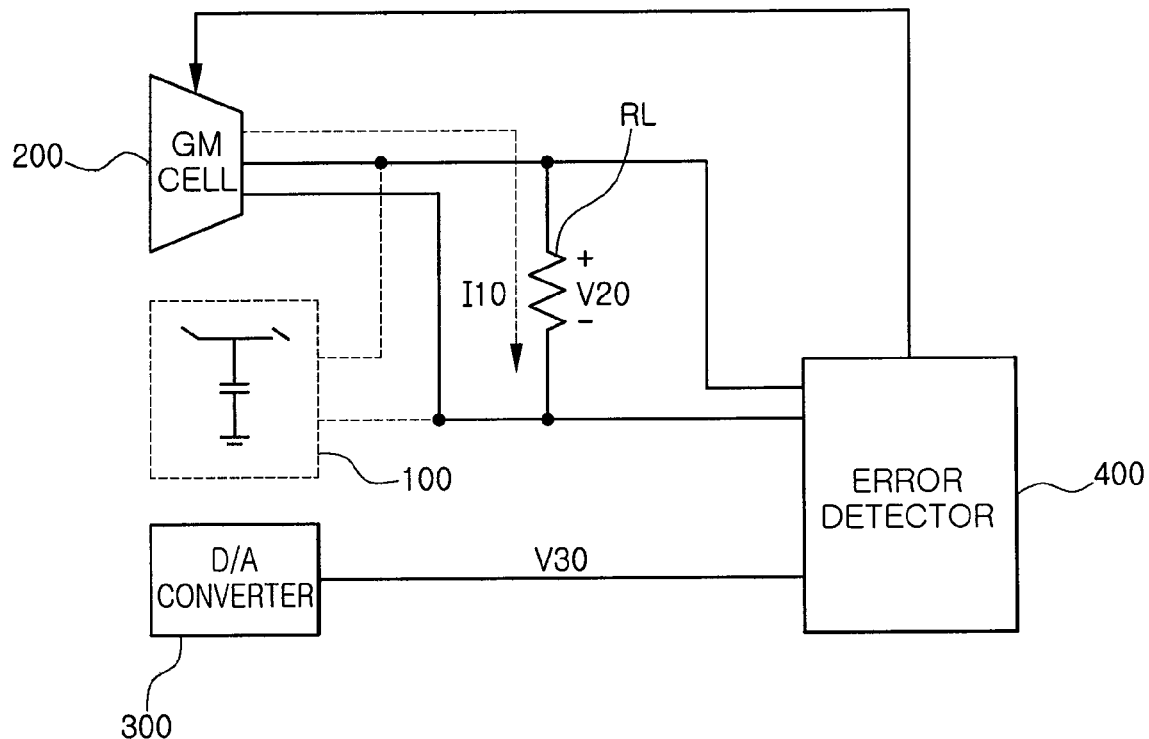
FIG. 4 is a block diagram of the tuning circuit of the $G_m$-C filter in a $G_m$ tuning mode according to the embodiment of the present invention.

FIG. 4 is a block diagram of the tuning circuit of the $G_m$-C filter in the $G_m$ tuning mode according to the embodiment of the present invention.

Referring to FIG. 4, in the $G_m$ tuning mode, the feedback control is performed to make the second voltage V20 output from the $G_m$ cell 200 become identical to the third voltage V30. Accordingly, the DAC tuner 500 can be disabled in the $G_m$ tuning mode.

Figure 5:
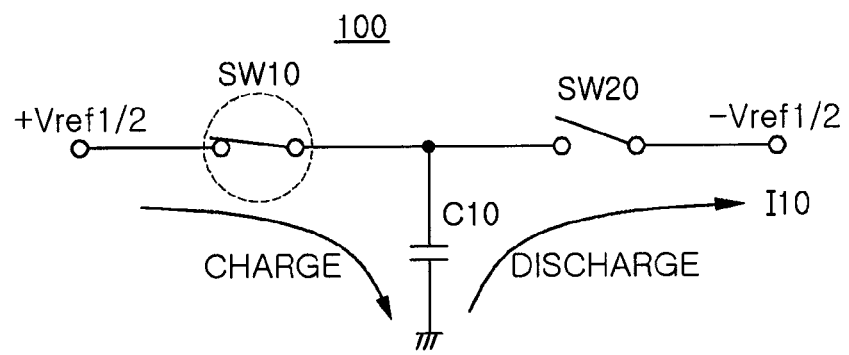
FIG. 5 is a circuit diagram of a switched capacitor according to the embodiment of the present invention.

FIG. 5 is a circuit diagram of a switched capacitor according to the embodiment of the present invention.

Referring to FIG. 5, the switched capacitor 100 includes a capacitor C10, a first switch SW10 and a second switch SW20. The capacitor C10 is connected between a ground voltage and a common node between the first switch SW10 and the second switch SW20. The first switch SW10 is connected between the common node and a first terminal +VREF1/2 of the first reference voltage VREF1. The second switch SW20 is connected between the common node and a second terminal −VREF1/2 of the first reference voltage VREF1. The first switch SW10 and the second switch SW20 are alternately turned on according to the clock signal.

In addition, the switched capacitor 100 may be disabled in the $G_m$ tuning mode to reduce power consumption and noise generation caused by the clock signal.

The second reference voltage may correspond to the capacitance of the capacitor without the process variations in the $G_m$-C filter.

Figure 6:
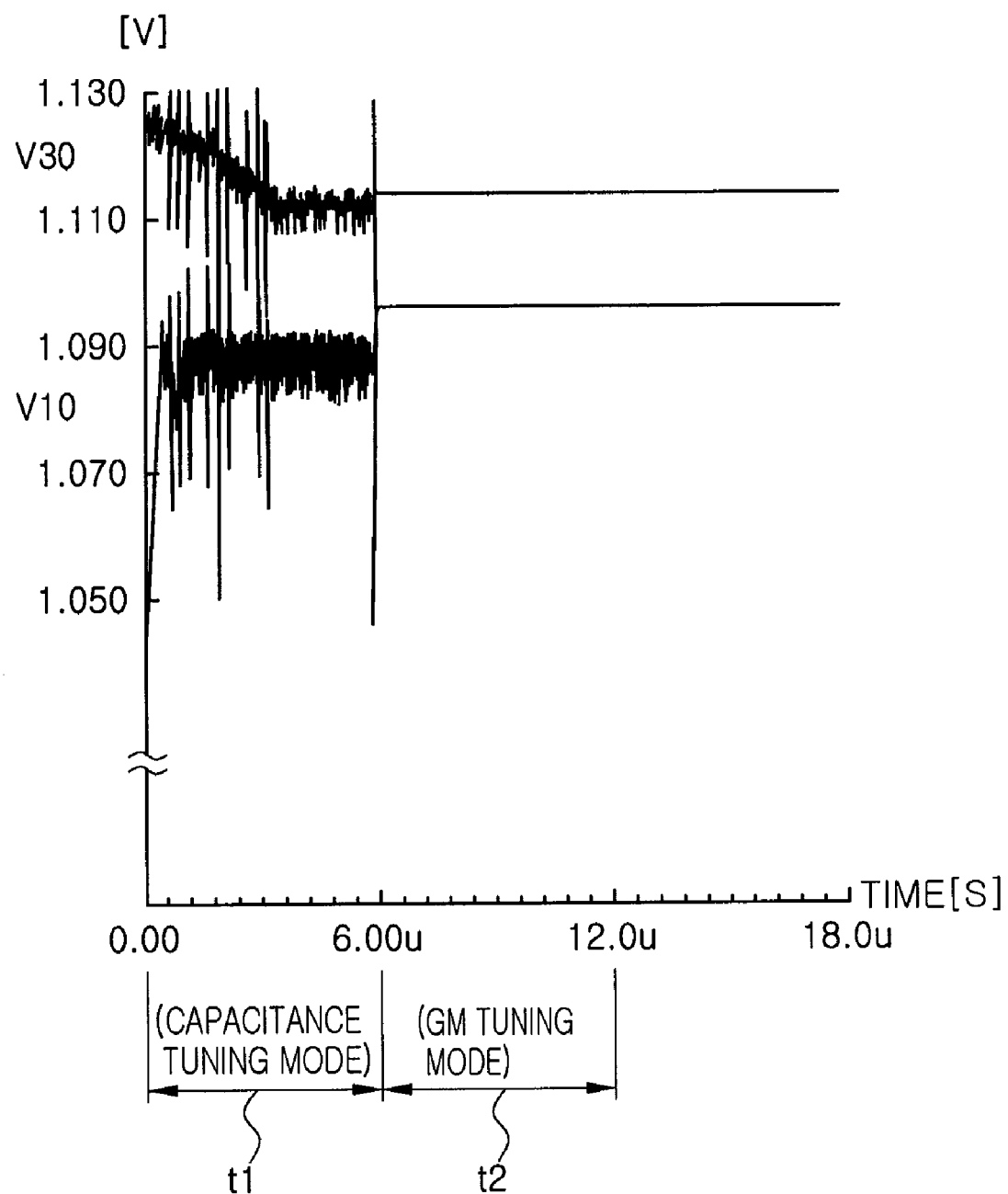
FIG. 6 is a graph showing waveforms of voltages in the capacitance tuning mode and the $G_m$ tuning mode according to an embodiment of the present invention.

FIG. 6 is a graph showing waveforms of voltages in a capacitance tuning mode and a $G_m$ tuning mode according to an embodiment of the present invention.

Referring to FIG. 6, V10 represents an output voltage of the switched capacitor 100 through the load resistor RL, and V30 represents an output voltage of the D/A converter 300. The capacitance tuning mode period is represented by t1, and the $G_m$ tuning mode period is represented by t2.

Hereinafter, operations and effects of the tuning circuit of the $G_m$-C filter will be described with reference to FIGS. 2 through 6.

Referring to FIG. 2, the tuning circuit of the $G_m$-C filter includes the switched capacitor 100, the $G_m$ cell 200, the load resistor RL, the D/A converter 300, the error detector 400, and the DAC tuner 500.

In the capacitance tuning mode, the error detector 400 first enters the capacitance tuning mode to perform the feedback control until the first voltage V10 and the third voltage V30 become identical, as shown in FIGS. 2 and 3.

Accordingly, according to the control of the error detector 400, the switched capacitor 100 is operated in the capacitance tuning mode. Then, the switched capacitor 100 charges/discharges the predetermined first reference voltage according to the clock signal to output the first current I10 incorporating the process variations of the capacitance.

Here, because the $G_m$ cell 200 is disabled, the load resistor RL converts the first current I10 output from the switched capacitor 100 to the first voltage V10.

In addition, the D/A converter 300 varies the predetermined second reference voltage according to the capacitance tuning coefficient, and converts the varied second reference voltage to the third voltage V30, which is an analog voltage. The second reference voltage may correspond to the capacitance of the capacitor without the process variations in the $G_m$-C filter.

The error detector 400 controls the capacitance tuning using the first difference voltage between the first voltage V10 and the third voltage V30 in the capacitance tuning mode.

Thereafter, the DAC tuner 500 controls the DAC tuning coefficient so that the DAC tuning coefficient corresponds to the first difference voltage according to the capacitance tuning control of the error detector 300 in the capacitance tuning mode, and then stores the DAC tuning coefficient in a register and provides the DAC tuning coefficient to the D/A converter 200. As such, the capacitance tuning is performed.

Referring to FIGS. 2 and 3, in the capacitance tuning mode, the feedback control is performed such that the third voltage V30 output from the D/A converter 300 becomes identical to the first voltage V10 output from the switched capacitor 100 through the load resistor RL. Accordingly, the $G_m$ cell 200 is disabled in the capacitance tuning mode.

Referring to FIG. 5, the first switch SW10 on an input side and the second switch SW20 on an output side are alternately turned on according to the clock signal to determine an equivalent resistance between the first terminal +VREF1/2 and the second terminal −VREF1/2 of the first reference voltage VREF1. That is, the capacitance of the capacitor C10 is converted to the equivalent resistance to output the first voltage I10 determined by the equivalent resistance and the first reference voltage VREF1.

Herebelow, the $G_m$ tuning mode will be described.

Referring to FIGS. 2 and 3, when the first voltage V10 and the third voltage V30 become identical, the error detector 400 enters the $G_m$ tuning mode. That is, the error detector 400 performs the feedback control so that the second voltage V20 and the third voltage V30 become identical.

Accordingly, according to the $G_m$ tuning control of the error detector 400, the $G_m$ cell 200 is operated in the $G_m$ tuning mode to perform the $G_m$ tuning according to the tuning coefficient.

Because the switched capacitor 100 is disabled in the $G_m$ tuning mode, the load resistor RL converts the second current I20 output from the $G_m$ cell 200 to the second voltage V20.

The D/A converter 300 converts the second reference voltage determined in the capacitance tuning mode to the third voltage V30, which is an analog voltage.

Accordingly, the error detector 400 controls the $G_m$ tuning coefficient so that the $G_m$ tuning coefficient corresponds to the second difference voltage between the second voltage V20 and the third voltage V30. In addition, the error detector 400 controls the $G_m$ tuning of the $G_m$ cell using the $G_m$ tuning coefficient. The feedback control is performed until the second voltage V20 and the third voltage V30 become identical.

Consequently, according to the $G_m$ tuning control of the error detector 400, the $G_m$ cell 200 is operated in the $G_m$ tuning mode to perform the $G_m$ tuning according to the $G_m$ tuning coefficient. As a result, the second voltage V20 and the third voltage V30 become identical, and thereby the effect of the temperature variations of the $G_m$ cell is got rid of.

Referring to FIGS. 2 and 4, in the $G_m$ tuning mode, the feedback control is performed such that the second voltage V20 output from the $G_m$ cell 200 becomes identical to the third voltage V30 output from the D/A converter 300. Accordingly, the DAC tuner 500 can be disabled in the $G_m$ tuning mode.

Referring to FIG. 6, during the capacitance tuning mode period t1, the first voltage V10 output from the switched capacitor through the load resistor RL and the third voltage V30 output from the D/A converter 300 fluctuate due to the effect of the clock signal. However, during the $G_m$ tuning mode period t2, the first voltage V10 and the third voltage V30 are stable almost without ripple components.

As described above, the digital tuning circuit of the $G_m$-C filter according to the embodiments of the present invention tunes the capacitance in the capacitance tuning mode and tunes the transconductance in the $G_m$ tuning mode. As such, the digital tuning circuit can tune the temperature variations of the transconductance as well as the process variations of the capacitance to permit more accurate tuning of the $G_m$-C filter.

In addition, the digital tuning circuit performs the capacitance tuning and the $G_m$ tuning in isolation. While the digital tuning circuit basically uses the clock signal in the capacitance tuning mode, it uses only direct current in the $G_m$ tuning mode for correcting the transconductance. As such, the clock signal is not used when receiving the signal, and thus it is possible to prevent the deterioration of the received signal.

While the present invention has been shown and described in connection with the exemplary embodiments, it will be apparent to those skilled in the art that modifications and variations can be made without departing from the spirit and scope of the invention as defined by the appended claims.

What is claimed is:

1. A digital tuning circuit of a $G_m$-C filter, comprising:
    a switched capacitor configured to operate in a capacitance tuning mode to charge/discharge a predetermined first reference voltage according to a clock signal, and output a first current incorporating process variations of a capacitance;
    a $G_m$ cell configured to operate in a $G_m$ tuning mode to perform $G_m$ tuning according to a $G_m$ tuning coefficient;
    a load resistor configured to convert the first current output from the switched capacitor to a first voltage in the capacitance tuning mode, and convert a second current output from the $G_m$ cell to a second voltage in the $G_m$ tuning mode;
    a D/A converter configured to vary a predetermined second reference voltage according to a DAC tuning coefficient, and convert the varied second reference voltage to a third voltage which is an analog voltage;
    an error detector configured to control capacitance tuning using a first difference voltage between the first voltage and the third voltage in the capacitance tuning mode, and control the $G_m$ tuning using the $G_m$ tuning coefficient corresponding to a second difference voltage between the second voltage and the third voltage in the $G_m$ tuning mode; and
    a DAC tuner configured to output to the D/A converter the DAC tuning coefficient corresponding to the first difference voltage according to the capacitance tuning control of the error detector in the capacitance tuning mode.

2. The digital tuning circuit of the $G_m$-C filter of claim 1, wherein the switched capacitor comprises:
    a capacitor connected between a ground voltage and a common node;

a first switch connected between a first terminal of the first reference voltage and the common node; and a second switch connected between a second terminal of the first reference voltage and the common node, and wherein the first switch and the second switch are alternately turned on according to the clock signal.

3. The digital tuning circuit of the $G_m$-C filter of claim 2, wherein the error detector enters the capacitance tuning mode when the operation of the digital tuning circuit is started to perform a feedback control until the first voltage and the third voltage become identical, and enters the $G_m$ tuning mode when the first voltage and the third voltage become identical to perform the feedback control until the second voltage and the third voltage become identical.

4. The digital tuning circuit of the $G_m$-C filter of claim 3, wherein the switched capacitor is disabled in the $G_m$ tuning mode.

5. The digital tuning circuit of the $G_m$-C filter of claim 3, wherein the $G_m$ cell is disabled in the capacitance tuning mode.

6. The digital tuning circuit of the $G_m$-C filter of claim 3, wherein the DAC tuner is disabled in the $G_m$ tuning mode.

7. The digital tuning circuit of the $G_m$-C filter of claim 3, wherein the second reference voltage corresponds to a capacitance of the capacitor without the process variations in the $G_m$-C filter.

* * * * *